(12) United States Patent
Kang et al.

(10) Patent No.: US 9,124,353 B2
(45) Date of Patent: Sep. 1, 2015

(54) SWITCHING CIRCUIT AND RF SWITCH INCLUDING THE SAME

(71) Applicant: SAMSUNG ELECTRO-MECHANICS CO., LTD., Suwon-Si, Gyeonggi-Do (KR)

(72) Inventors: Suk Chan Kang, Suwon-Si (KR); Ho Kwon Yoon, Suwon-Si (KR); Jeong Hoon Kim, Suwon-Si (KR); Joong Jin Nam, Suwon-Si (KR); Kyu Jin Choi, Suwon-Si (KR); Kwang Du Lee, Suwon-Si (KR); Jae Hyouck Choi, Suwon-Si (KR); Kyung Hee Hong, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/258,850

(22) Filed: Apr. 22, 2014

(65) Prior Publication Data

US 2015/0188600 A1 Jul. 2, 2015

(30) Foreign Application Priority Data

Dec. 27, 2013 (KR) .......................... 10-2013-0165454

(51) Int. Cl.
*H04B 1/44* (2006.01)
*H03K 17/687* (2006.01)

(52) U.S. Cl.
CPC ................ *H04B 1/44* (2013.01); *H03K 17/687* (2013.01)

(58) Field of Classification Search
CPC .......................... H03K 17/6871; H03K 17/693
See application file for complete search history.

(56) References Cited

U.S. PATENT DOCUMENTS

| 4,902,910 | A  | * | 2/1990 | Hsieh ............................ 327/143 |
| 6,046,622 | A  | * | 4/2000 | Miles ............................ 327/427 |
| 2007/0285149 | A1 | * | 12/2007 | Nakatani et al. ............... 327/427 |
| 2009/0023415 | A1 | * | 1/2009 | Seshita ......................... 455/333 |
| 2009/0079499 | A1 | * | 3/2009 | Scuteri et al. ................. 330/253 |

FOREIGN PATENT DOCUMENTS

| JP | 2007-329646 A | 12/2007 |
| KR | 10-2013-0041991 A | 4/2013 |
| WO | 2012/015849 A1 | 2/2012 |

* cited by examiner

*Primary Examiner* — David Bilodeau
(74) *Attorney, Agent, or Firm* — NSIP Law (57) ABSTRACT

A switching circuit may include: the switching circuit includes a switching circuit unit including a first transistor and a second transistor connected to each other in series, the second transistor receiving a first control signal through a control terminal thereof, and an inverter connected between a control terminal of the first transistor and a first terminal of the first transistor. The inverter receives a second control signal and maintains a gate-source voltage level of the first transistor to a threshold voltage level of the first transistor or less, and levels of the first and second control signals are logically complementary to each other.

11 Claims, 5 Drawing Sheets

SWITCHING CIRCUIT AND RF SWITCH INCLUDING THE SAME

CROSS-REFERENCE TO RELATED APPLICATION

This application claims the benefit of Korean Patent Application No. 10-2013-0165454 filed on Dec. 27, 2013, with the Korean Intellectual Property Office, the disclosure of which is incorporated herein by reference.

BACKGROUND

The present disclosure relates to a switching circuit and an RF (Radio Frequency) switch including the same.

Along with developments in wireless communications technologies, various communications standards have been simultaneously implemented. In addition, along with a trend for miniaturized wireless communications modules and high performance portable terminals, there has been a need for compliance with a plurality of communication standards in a single portable terminal. Thus, more frequency bands need to be supported by a single portable terminal.

That is, existing second-generation (2G) and third-generation (3G) communications technologies have been supplemented with new communications technologies, such that portable communications terminals compliant with fourth-generation (4G) communications schemes such as Long Term Evolution (LTE) have been developed. In addition, in the area of Wi-Fi communications, portable communications terminals have been implemented with the ability to operate with the IEEE 802.11ac standard in addition to the existing IEEE 802.11b/g/n to enhance marketability thereof.

In accordance with this trend, there has also been demand for support for various frequency bands within a radio frequency (RF) front end field. For example, support for various frequency bands with respect to an RF switch positioned on a signal path between an antenna and an RF chipset has been demand. Therefore, a Single Pole Double Throw (SPDT) type switch has been used in various applications.

Recently, as processing technologies based on field effect transistors (FETs) such as complementary metal-oxide semiconductors (CMOS) or the like have been developed, FETs have been widely used to manufacture electrical switches. However, when a high power RF signal is applied to such an electrical switch, a source voltage swing may be lower than a threshold voltage (Vth), and in this case, problems may arise in that the switch may be unintentionally turned on. That is, when a gate of an FET is turned off to zero (0) V, if negative swing of an input signal applied to a source is equal to or higher than the threshold voltage Vth to satisfy the condition Vgs>Vth, problems arise in that the switch may be turned on.

The Related Art Document discloses a radio frequency (RF) shield switch, in which a source and bulk simultaneously short-circuit when an RF switch is turned on, thereby reducing a threshold voltage of a main transistor. However, the Related Art Document does not disclose that a voltage level of Vgs is maintained to a threshold voltage level or less using an inverter so as to prevent a switch from being turned on even when a large RF signal is suddenly input.

RELATED ART DOCUMENT

Korean Patent Laid-Open Publication No. 10-2013-0041991

SUMMARY

Some embodiments of the present disclosure may provide a switching circuit and an RF switch including the same, maintaining a voltage level of Vgs in a transistor to a threshold voltage level or less using an inverter, thereby preventing a switch from being turned on.

According to some embodiments of the present disclosure, a switching circuit may include a switching circuit unit including a first transistor and a second transistor connected to each other in series, the second transistor receiving a first control signal through a control terminal thereof, and an inverter connected between a control terminal of the first transistor and a first terminal of the first transistor, wherein the inverter receives a second control signal and maintains a gate-source voltage level of the first transistor to a threshold voltage level of the first transistor or less, and levels of the first and second control signals are logically complementary to each other.

The inverter may include a third transistor and a fourth transistor connected to each other in series, and the third transistor may be a P-type transistor, and the fourth transistor may be an N-type transistor.

The third and fourth transistors may receive the second control signal through respective control terminals thereof and perform a logical complementary switching operation.

The third transistor may have a first terminal connected to a control terminal of the first transistor and a second terminal receiving a driving voltage.

The inverter may maintain a voltage difference between the control terminal of the first transistor and the first terminal of the first transistor to the same level when second transistor is turned off.

According to some embodiments of the present disclosure, an RF switch may include a common port connected to an antenna and transmitting and receiving a high frequency signal, a reception switching unit performing a switching operation to open a signal transfer path between the common port and a reception port in a reception mode, and a transmission switching unit performing a switching operation to open a signal transfer path between the common port and a transmission port in a transmission mode, wherein the reception switching unit includes a first switching unit including a first transistor and a second transistor connected to each other in series between the common port and the reception port, and a first inverter connected between a control terminal of the first transistor and a first terminal of the first transistor, and the transmission switching unit includes a second switching unit including a third transistor and a fourth transistor connected to each other in series between the common port and the transmission port, and a second inverter connected between a control terminal of the third transistor and a second terminal of the third transistor.

In the transmission mode, a low signal may be provided to a control terminal of the second transistor, a high signal may be provided to the first inverter, and the first inverter maintains a gate-source voltage level of the first transistor to a threshold voltage level of the first transistor or less according to the high signal, and the high signal may be provided to a control terminal of the fourth transistor, the low signal may be provided to the second inverter, and the second inverter receives a driving voltage from an external source to turn on the third transistor according to the low signal.

In the reception mode, a high signal may be provided to a control terminal of the second transistor, a low signal is provided to the first inverter, and the first inverter receives a driving voltage from an external source to turn on the first transistor according to the low signal; and the low signal may be provided to a control terminal of the fourth transistor, the high signal is provided to the second inverter, and the second inverter maintains a gate-drain voltage level of the third transistor to a threshold voltage level of the third transistor or less according to the high signal.

The first inverter may include a fifth transistor and a sixth transistor connected to each other in series, the fifth transistor may be a P-type transistor and the sixth transistor may be an N-type transistor; and the second inverter may include a seventh transistor and a eighth transistor connected to each other in series, the seventh transistor is a P-type transistor, and the eighth transistor is an N-type transistor.

The fifth transistor may have a first terminal connected to a control terminal of the first transistor and a second terminal receiving a driving voltage, and the seventh transistor may have a second terminal connected to a control terminal of the third transistor and a first terminal receiving a driving voltage.

The RF switch may further include a first shunting portion connected between the reception port and the reception switching unit to open or shut a signal transfer path between the reception port and a ground, and a second shunting portion connected between the transmission port and the transmission switching unit to open or shut a signal transfer path between the transmission port and a ground.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. Throughout the drawings, the same or like reference numerals will be used to designate the same or like elements.

Figure 1:
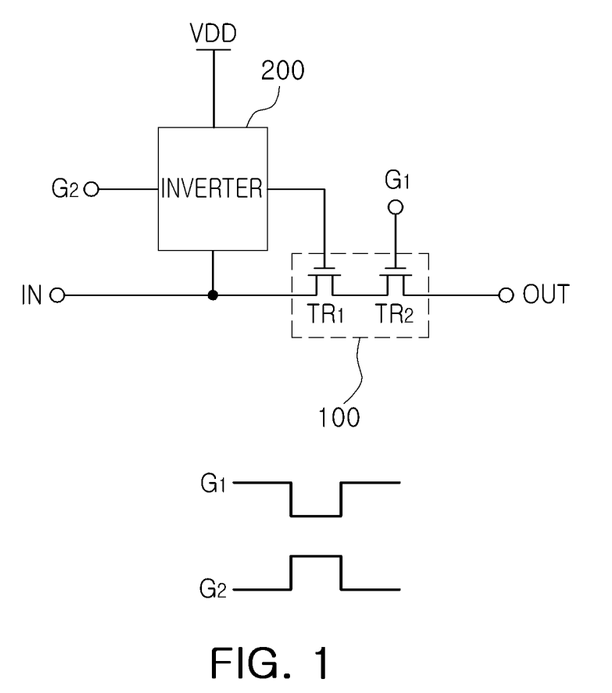
FIG. 1 is a block diagram of a switching circuit according to an exemplary embodiment of the present disclosure.

FIG. 1 is a block diagram of a switching circuit according to an exemplary embodiment of the present disclosure.

Referring to FIG. 1, the switching circuit according to the exemplary embodiment of the present disclosure may include a switching circuit unit 100 and an inverter 200.

The switching circuit unit 100 may include a first transistor TR1 and a second transistor TR2 connected to each other in series. The first transistor TR1 may have a control terminal to which output of the inverter 200 is provided and the second transistor TR2 may have a control terminal to which a first control signal G1 is provided.

The inverter 200 may be connected between the control terminal of the first transistor TR1 and a first terminal. In this case, according to an exemplary embodiment of the present disclosure, in the case that the first transistor TR1 is determined as a metal-oxide semiconductor field effect transistor (MOSFET), the first terminal may be a source of the first transistor TR1, and the control terminal may be a gate of the first transistor TR1. Hereinafter, a detailed description will be given with the case in which the first to fourth transistors TR1 to TR4 included in the switching circuit according to the exemplary embodiment of the present disclosure are MOSFETs.

The inverter 200 may receive a second control signal G2. In this case, a level of the second control signal G2 may be logically complementary to a level of the first control signal G1. Hereinafter, the inverter 200 will be described in detail with reference to FIG. 2.

Figure 2:
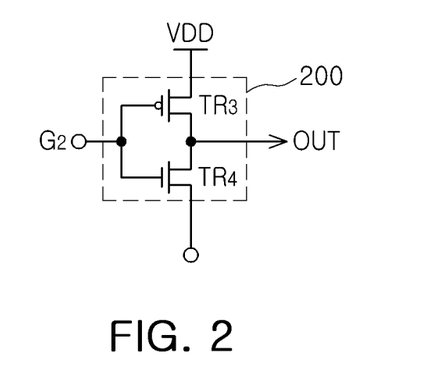
FIG. 2 is a circuit diagram of an inverter included in the switching circuit illustrated in FIG. 1.

FIG. 2 is a circuit diagram of the inverter 200 included in the switching circuit illustrated in FIG. 1.

Referring to FIG. 2, the inverter 200 may include the third transistor TR3 and the fourth transistor TR4 connected to each other in series. In this case, the third transistor TR3 may be a P-type transistor, and the fourth transistor TR4 may be an N-type transistor. In this case, the third and fourth transistors TR3 and TR4 may have a control terminal to which the second control signal G2 is provided. For example, the third transistor TR3 and the fourth transistor TR4 may receive the second control signal G2 through a respective gate thereof and may perform a logical complementary switching operation to each other.

In addition, the third transistor TR3 may receive a driving voltage VDD through a second terminal. In this case, in the case that the third transistor TR3 is a MOSFET, the second terminal may be a drain.

Next, an operation of a switching circuit according to an exemplary embodiment of the present disclosure will be described with reference to FIG. 3.

Figure 3:
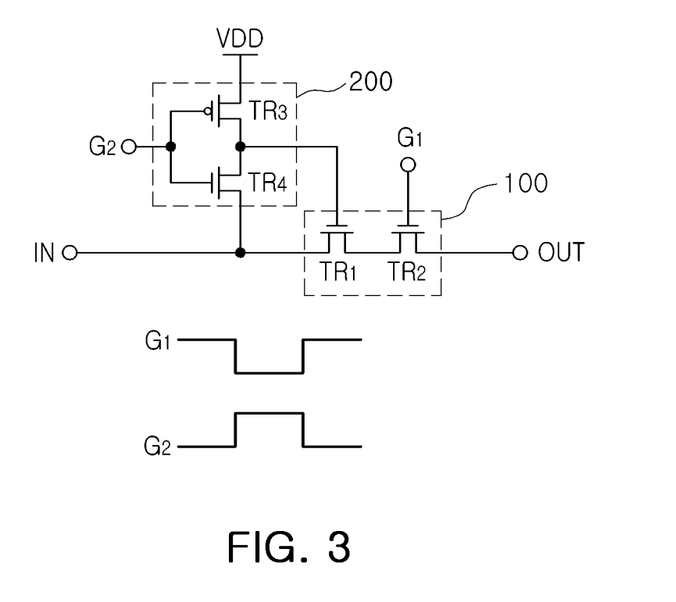
FIG. 3 is a circuit diagram of a switching circuit illustrated in FIG. 1.

FIG. 3 is a circuit diagram of the switching circuit illustrated in FIG. 1.

Referring to FIG. 3, first, the first control signal G1 and the second control signal G2 are logically complementary to each other. For example, in the case that the first control signal G1 is high, the second control signal G2 is low, and in the case that the first control signal G1 is low, the second control signal G2 is high.

In order to shut a signal transfer path to an output terminal OUT from an input terminal IN, both the first transistor TR1 and the second transistor TR2 need to be turned off. However, in the case that the input terminal IN provides a large signal, the signal may be output in a leakage form through the output terminal OUT. In this case, when a gate-source voltage Vgs of the first transistor TR1 is greater than a threshold voltage Vth at negative swing of the large signal, the first transistor TR1 may be unintentionally turned on. Thus, there may be difficulties in obtaining high power handling of a switching circuit.

Accordingly, in order to shut a signal transfer path to the output terminal OUT from the input terminal IN, in the switching circuit according to the exemplary embodiment of the present disclosure, the first control signal G1 as a low signal may be provided to a gate of the second transistor TR2, and the second control signal G2 as a high signal may be provided to the inverter 200. Thus, the second transistor TR2 may receive the first control signal G1 as a low signal and may be turned off. The third transistor TR3 may be a P-type transistor, may receive the second control signal G2 as a high signal through a gate, and may be turned off. In addition, the fourth transistor TR4 may receive the second control signal G2 as a high signal through a gate and may be turned on.

For example, when on-resistance of the fourth transistor TR4 is lower than parasitic impedance of the first transistor TR1, the first transistor TR1 may maintain a gate voltage and source voltage of the first transistor TR1 at the same level. In other words, even when a large signal is input to the input terminal IN, the fourth transistor TR4 included in the inverter 200 may receive the second control signal G2, and thus, the gate-source voltage Vgs of the first transistor TR1 may be maintained to be equal to or less than the threshold voltage Vth of the first transistor TR1.

Thus, a turned-off state may be maintained so that the second transistor TR2 may not be turned on by maintaining a voltage difference between the gate and the source of the first transistor TR1 to the same level.

Figure 4A:
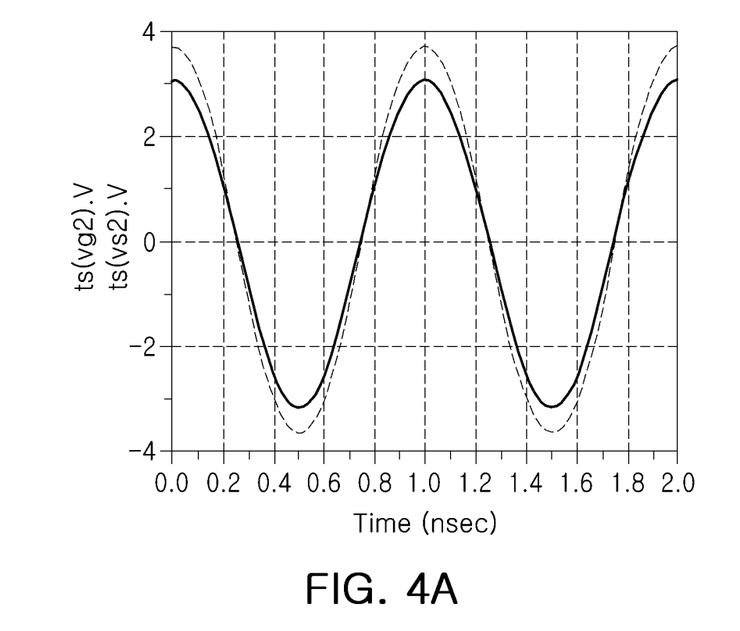
FIGS. 4A and 4B are a graph illustrating an operation result of a switching circuit according to an exemplary embodiment of the present disclosure.
Figure 4B:
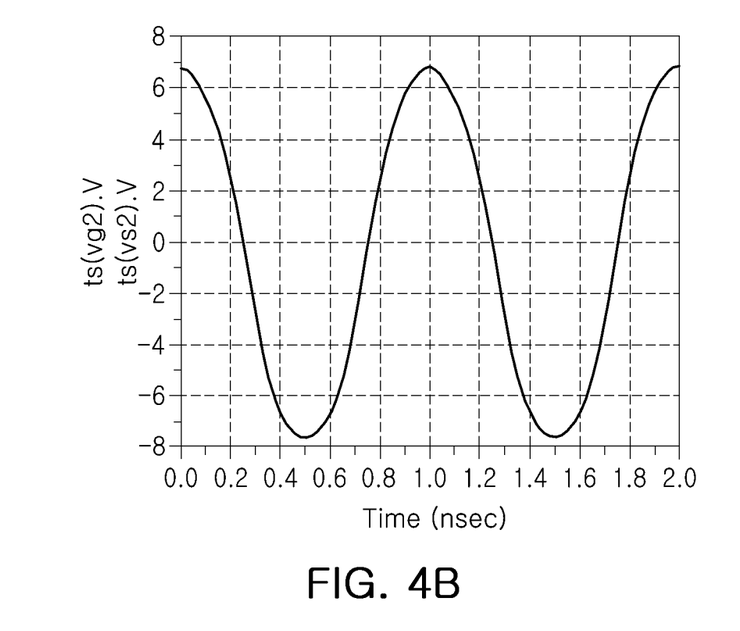

FIGS. 4A and 4B are graphs illustrating operation results of a switching circuit according to an exemplary embodiment of the present disclosure.

Referring to FIG. 4, FIG. 4A illustrates a simulation result of a voltage between a source and gate of the first transistor TR1 in a switching circuit having an input signal of 25 dBm at 1 GHz according to the related art.

FIG. 4B illustrates a simulation result of a voltage between a source and gate of the first transistor TR1 in the switching circuit according to the exemplary embodiment of the present disclosure having an input signal of 25 dBm at 1 GHz.

As seen from FIG. 4, compared with the switching circuit of FIG. 4A according to the related art, the switching circuit according to the exemplary embodiment of the present disclosure illustrated in FIG. 4B maintains the gate-source voltage Vgs of the first transistor TR1 at the same level, thereby achieving high power handling.

Figure 5:
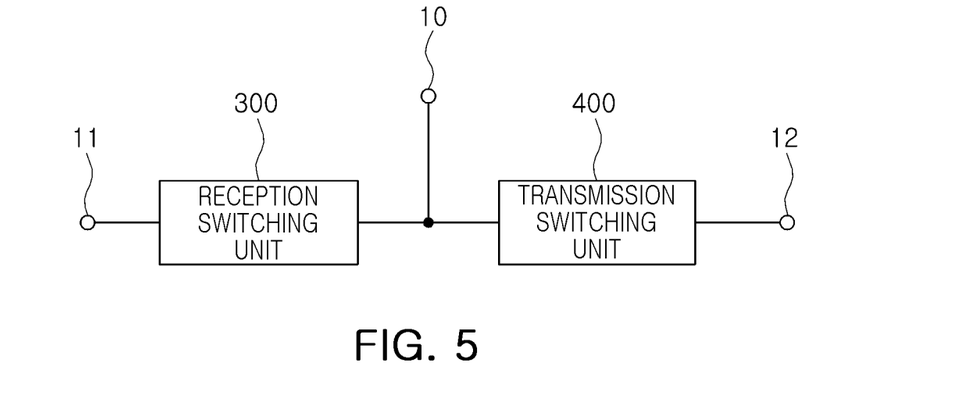
FIG. 5 is a block diagram illustrating an RF switch according to another exemplary embodiment of the present disclosure.

FIG. 5 is a block diagram illustrating an RF switch according to another exemplary embodiment of the present disclosure.

Figure 6:
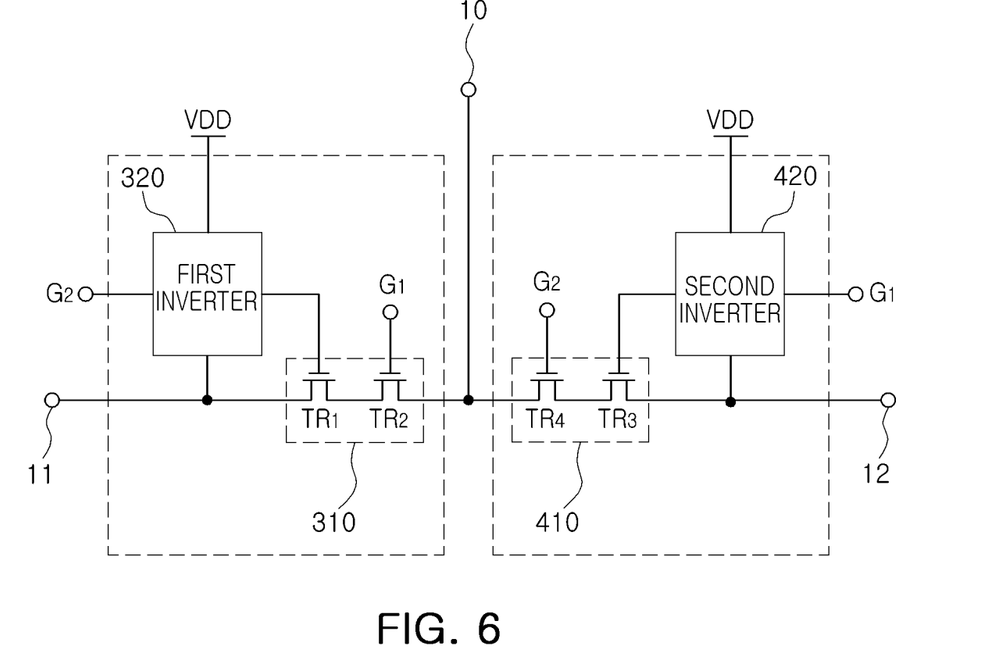
FIG. 6 is a block diagram illustrating an RF switch of FIG. 5 in more detail.

FIG. 6 is a block diagram illustrating the RF switch illustrated in FIG. 5 in more detail.

Referring to FIG. 5, an RF switch according to another exemplary embodiment of the present disclosure may include a common port 10, a reception switching unit 300, and a transmission switching unit 400.

The common port 10 may be connected to an antenna to transmit and receive a high frequency signal.

Referring to FIG. 6, the reception switching unit 300 may include a first switching unit 310 including the first transistor TR1 and the second transistor TR2 connected in series between the common port 10 and the reception port 11, and a first inverter 320 that is connected to a control terminal of the first transistor TR1 and a first terminal of the first transistor TR1.

In this case, according to an exemplary embodiment of the present disclosure, the first and second transistors TR1 and TR2 may be MOSFETs. Hereinafter, a detailed description will be given on the assumption that the first and second transistors TR1 and TR2 are MOSFETs.

In addition, the transmission switching unit 400 may include a second switching unit 410 including the third transistor TR3 and the fourth transistor TR4 connected to each other in series between the common port 10 and a transmission port 12, and a second inverter 420 that is connected to a control terminal of the third transistor TR3 and a second terminal of the third transistor TR3.

In this case, according to an exemplary embodiment of the present disclosure, the third transistor TR3 and the fourth transistor TR4 may be MOSFETs. Hereinafter, a detailed description will be given on the assumption that the third and fourth transistors TR3 and TR4 are MOSFETs.

Next, an operation of an RF switch according to the exemplary embodiment of the present disclosure will be described in detail with reference to FIG. 7.

Figure 7:
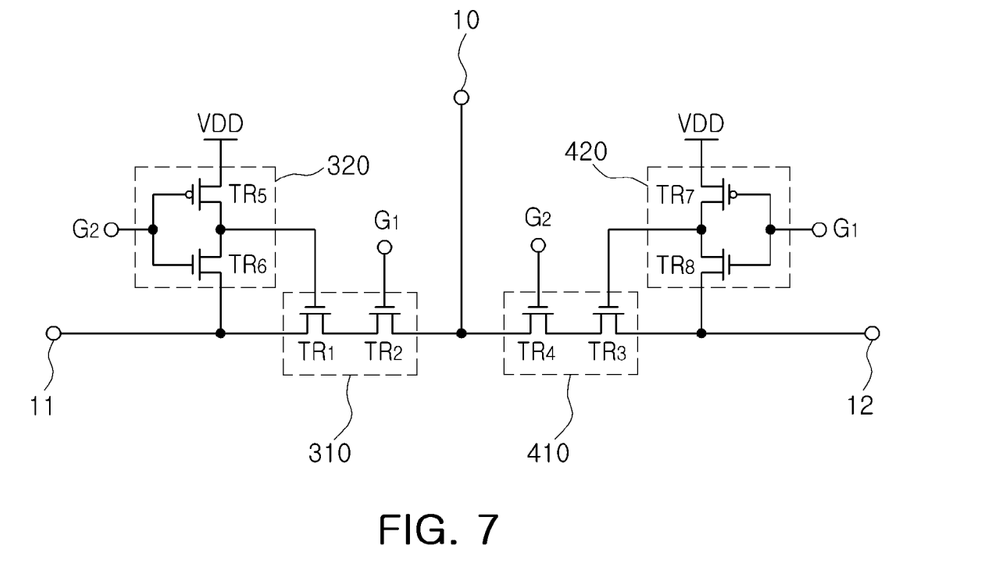
FIG. 7 is a circuit diagram illustrating the RF switch of FIG. 5 in more detail.

FIG. 7 is a circuit diagram of the RF switch illustrated in FIG. 5.

Referring to FIG. 7, the first inverter 320 may include a fifth transistor TR5 and a sixth transistor TR6 connected to each other in series, the fifth transistor TR5 may be a P-type transistor, and the sixth transistor TR6 may be an N-type transistor.

In this case, according to an exemplary embodiment of the present disclosure, the fifth and sixth transistors TR5 and TR6 may be MOSFETs and may receive the second control signal G2 through a respective gate thereof. In addition, the fifth transistor TR5 may receive a driving voltage VDD through a drain thereof, and a source of the sixth transistor TR6 may be connected to a source of the first transistor TR1.

The second inverter 420 may include a seventh transistor TR7 and an eighth transistor TR8 connected to each other in series. The seventh transistor TR7 may be a P-type transistor and the eighth transistor TR8 may be an N-type transistor.

In this case, according to an exemplary embodiment of the present disclosure, the seventh and eighth transistors TR7 and TR8 may be MOSFETs and may receive the first control signal G1 through a respective gate thereof. In addition, the seventh transistor TR7 may receive the driving voltage VDD through a source, and a drain of the eighth transistor TR8 may be connected to a drain of the third transistor TR3.

The reception switching unit 300 may perform a switching operation to open or shut a signal transfer path between the reception port 11 and the common port 10. In addition, the transmission switching unit 400 may perform a switching operation to open or shut a signal transfer path between the transmission port 12 and the common port 10.

In further detail, an RF switch according to the embodiment of the present disclosure may operate in a transmission or reception mode.

In this case, the transmission switching unit 400 may perform a switching operation to open a signal transfer path between the common port 10 and the transmission port 12 in the transmission mode. In this case, the reception switching unit 300 may perform a switching operation to shut a signal transfer path between the common port 10 and the reception port 11.

For example, an operation of the reception switching unit 300 in the transmission mode will now be described. A low signal is provided to a gate of the second transistor TR2 such that the second transistor TR2 may be turned off. In addition, a high signal may be provided to the fifth and sixth transistors TR5 and TR6 included in the first inverter 320. Thus, the fifth transistor TR5 is turned off and the sixth transistor TR6 is turned on. In this case, a gate voltage Vg of the first transistor TR1 and a source voltage Vs of the first transistor TR1 may be maintained to the same level, and thus, the first transistor TR1 may be maintained in a turned-off state.

On the other hand, with regard to the transmission switching unit 400 in the transmission mode, a high signal is provided to a gate of the fourth transistor TR4 such that the fourth transistor TR4 moves into a turned-on state. In addition, a low signal may be provided to the seventh and eight transistors TR7 and TR8 included in the second inverter 420. Thus, the seventh transistor TR7 moves into a turned-on state and the eighth transistor TR8 moves into a turned-off state. Thus, a gate voltage of the third transistor TR3 may become the driving voltage VDD such that the third transistor TR3 moves into a turned-on state.

For example, a gate-source voltage level of the first transistor TR1 may be maintained to a threshold voltage level or less of the first transistor TR1, thereby preventing the first transistor TR1 from being unintentionally converted into a turned-on state in the case of large signal.

The reception switching unit 300 may perform a switching operation to open a signal transfer path between the common port 10 and the reception port 11 in the reception mode. In this case, the transmission switching unit 400 may perform a switching operation to shut a signal transfer path between the common port 10 and the transmission port 12.

For example, an operation of the reception switching unit 300 in the reception mode will now be described. A high signal is provided to a gate of the second transistor TR2 such that the second transistor TR2 is turned on. In addition, a low signal may be provided to the fifth and sixth transistors TR5 and TR6 included in the first inverter 320. Thus, the fifth transistor TR5 is turned on and the sixth transistor TR6 is turned off. Thus, a gate voltage of the first transistor TR1 may become the driving voltage VDD such that the first transistor TR1 is also turned on.

On the other hand, with regard to the transmission switching unit 400 in the reception mode, a low signal is provided to a gate of the fourth transistor TR4 such that the fourth transistor TR4 moves into a turned-off state. In addition, a high signal may be provided to the seventh and eight transistors TR7 and TR8 included in the second inverter 420. Thus, the seventh transistor TR7 moves into a turned-off state and the eighth transistor TR8 moves into a turned-on state. In this case, a gate voltage Vg of the third transistor TR3 and a drain voltage Vd of the third transistor TR3 may be maintained to the same level to maintain a turned-off state of the third transistor TR3. For example, a gate-drain voltage level of the third transistor TR3 may be maintained to a threshold voltage level or less of the third transistor TR3, thereby preventing the third transistor TR3 from being unintentionally converted into a turned-on state in the case of a large signal.

Figure 8:
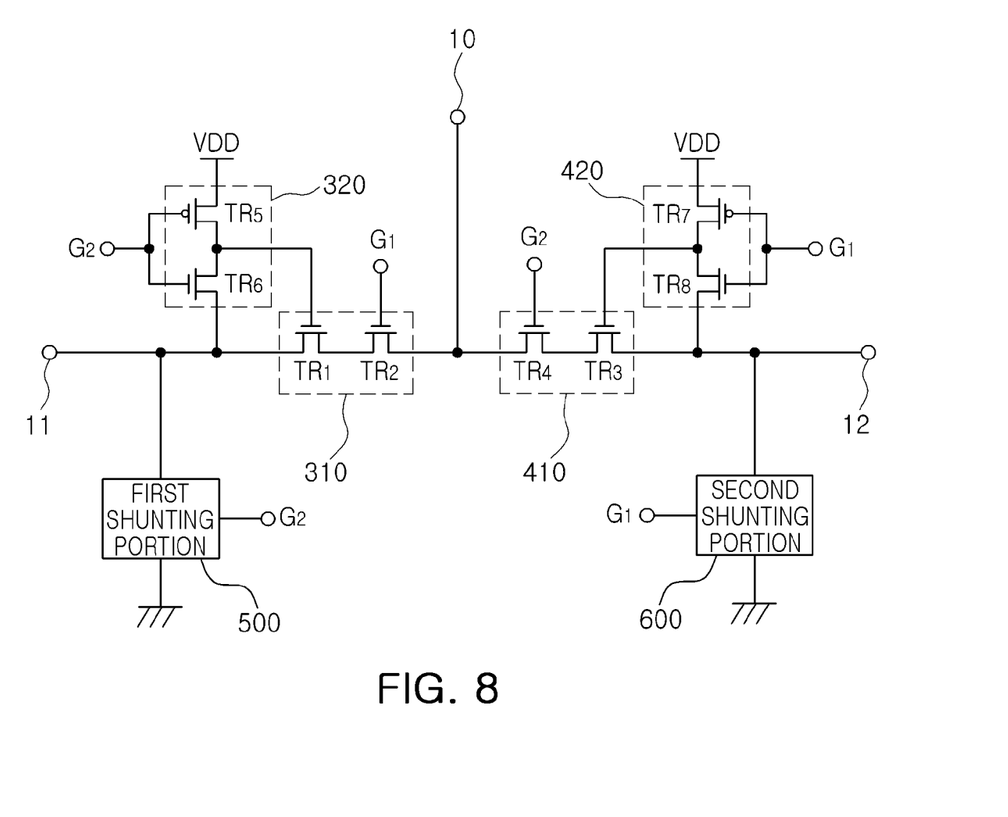
FIG. 8 is a circuit diagram illustrating an example of adding shunting portions to the RF switch illustrated in FIG. 5.

FIG. 8 is a circuit diagram illustrating an example of adding shunting portions to the RF switch illustrated in FIG. 5.

Referring to FIG. 8, the RF switch according to the exemplary embodiment of the present disclosure may further include a first shunting portion 500 and a second shunting portion 600.

The first shunting portion 500 may be connected between the reception port 11 and the reception switching unit 300 to open or shut a signal transfer path between the reception port 11 and a ground. In this case, the first shunting portion 500 may include a plurality of switch devices connected to one another in series. The plurality of respective switch devices may receive the second control signal G2 through a control terminal thereof to perform a switching operation.

The second shunting portion 600 may be connected between the transmission port 12 and the transmission switching unit 400 to open or shut a signal transfer path between the transmission port 12 and a ground. In this case, the second shunting portion 600 may include a plurality of switch devices connected to each other in series. The plurality of switch devices may receive the first control signal G1 through a control terminal thereof to perform a switching operation.

The switching circuit according to the exemplary embodiment of the present disclosure and an RF switch including the same may prevent a switch from being unintentionally turned on even when a large RF signal is suddenly input, thereby preventing leakage current.

While exemplary embodiments have been shown and described above, it will be apparent to those skilled in the art that modifications and variations could be made without departing from the spirit and scope of the present disclosure as defined by the appended claims.

What is claimed is:

1. A switching circuit comprising:
a switching circuit unit including a first transistor and a second transistor connected to each other in series, the second transistor receiving a first control signal through a control terminal of the second transistor; and
an inverter connected between a control terminal of the first transistor and a first terminal of the first transistor,
wherein the inverter receives a second control signal and maintains a gate-source voltage level of the first transistor to a threshold voltage level of the first transistor or less; and
levels of the first and second control signals are logically complementary to each other.

2. The switching circuit of claim 1, wherein:
the inverter includes a third transistor and a fourth transistor connected to each other in series; and
the third transistor is a P-type transistor and the fourth transistor is an N-type transistor.

3. The switching circuit of claim 2, wherein the third and fourth transistors receive the second control signal through respective control terminals and perform a logical complementary switching operation.

4. The switching circuit of claim 2, wherein the third transistor has a first terminal connected to a control terminal of the first transistor and a second terminal receiving a driving voltage.

5. The switching circuit of claim 1, wherein the inverter maintains a voltage difference between the control terminal of the first transistor and the first terminal of the first transistor to the same level when the second transistor is turned off.

6. An RF switch comprising:
a common port connected to an antenna and transmitting and receiving a high frequency signal;
a reception switching unit performing a switching operation to open a signal transfer path between the common port and a reception port in a reception mode; and
a transmission switching unit performing a switching operation to open a signal transfer path between the common port and a transmission port in a transmission mode,
wherein the reception switching unit comprises a first switching unit including a first transistor and a second transistor connected to each other in series between the common port and the reception port, and a first inverter connected between a control terminal of the first transistor and a first terminal of the first transistor; and
the transmission switching unit includes a second switching unit including a third transistor and a fourth transistor connected to each other in series between the common port and the transmission port, and a second inverter connected between a control terminal of the third transistor and a second terminal of the third transistor.

7. The RF switch of claim 6, wherein in the transmission mode, a low signal is provided to a control terminal of the second transistor, a high signal is provided to the first inverter, and the first inverter maintains a gate-source voltage level of the first transistor to a threshold voltage level of the first transistor or less according to the high signal; and the high signal is provided to a control terminal of the fourth transistor, the low signal is provided to the second inverter, and the second inverter receives a driving voltage from an external source to turn on the third transistor according to the low signal.

8. The RF switch of claim 6, wherein in the reception mode, a high signal is provided to a control terminal of the second transistor, a low signal is provided to the first inverter, and the first inverter receives a driving voltage from an external source to turn on the first transistor in response to the low signal; and the low signal is provided to a control terminal of the fourth transistor, the high signal is provided to the second inverter, and the second inverter maintains a gate-drain voltage level of the third transistor to a threshold voltage level of the third transistor or less according to the high signal.

9. The RF switch of claim 6, wherein:

the first inverter includes a fifth transistor and a sixth transistor connected to each other in series, the fifth transistor is a P-type transistor, and the sixth transistor is an N-type transistor; and the second inverter includes a seventh transistor and a eighth transistor connected to each other in series, the seventh transistor is a P-type transistor, and the eighth transistor is an N-type transistor.

10. The RF switch of claim 9, wherein:

the fifth transistor has a first terminal connected to a control terminal of the first transistor and a second terminal receiving a driving voltage; and the seventh transistor has a second terminal connected to a control terminal of the third transistor and a first terminal receiving a driving voltage.

11. The RF switch of claim 6, further comprising:

a first shunting portion connected between the reception port and the reception switching unit to open or shut a signal transfer path between the reception port and a ground; and a second shunting portion connected between the transmission port and the transmission switching unit to open or shut a signal transfer path between the transmission port and a ground.

* * * * *